United States Patent [19]
Stutzmann et al.

[11] Patent Number: 5,578,379
[45] Date of Patent: Nov. 26, 1996

[54] DEVICE COMPRISING A LUMINESCENT MATERIAL

[75] Inventors: Martin Stutzmann, Stuttgart; Martin S. Brandt, Leonberg; Alf Breitschwerdt, Stuttgart; Heinz D. Fuchs, Boeblingen; Joerg Weber, Gerlingen, all of Germany

[73] Assignee: Max-Planck-Gesellschaft zur Foerderung der Wissenschaften e.V., Goettingen, Germany

[21] Appl. No.: 985,181

[22] Filed: Dec. 2, 1992

[30] Foreign Application Priority Data

Dec. 3, 1991 [DE] Germany ............ 41 39 852.1

[51] Int. Cl.$^6$ ............ B32B 9/00; C09K 11/59
[52] U.S. Cl. ............ 428/446; 428/209; 428/432; 428/448; 428/450; 428/457; 428/690; 428/700; 428/917; 313/503; 313/509; 252/301.4 F; 250/370.11; 250/483.1; 257/84; 372/39; 372/41
[58] Field of Search ............ 428/195, 209, 428/411.1, 432, 446, 450, 688, 689, 690, 700, 704, 917, 448, 457; 313/503, 509, 463; 252/301.4 F; 250/370.11, 552, 553, 483.1, 214.1; 257/79, 84; 372/39, 41

[56] References Cited

U.S. PATENT DOCUMENTS

| | | | |
|---|---|---|---|
| 2,996,403 | 8/1961 | Feldman | 428/917 X |
| 3,774,022 | 11/1973 | Dubrow et al. | 240/2.25 |
| 3,927,224 | 12/1975 | Levene | 427/64 |
| 4,798,681 | 1/1989 | Oversluizen et al. | 252/301.4 F |
| 4,931,692 | 6/1990 | Takagi et al. | 313/503 |
| 5,004,956 | 4/1991 | Kun et al. | 315/169.3 |
| 5,077,143 | 12/1991 | Barraclough et al. | 428/690 |

OTHER PUBLICATIONS

Hirabayashi et al, "Optical Properties of Disordered Silicide Layer Compound: Siloxene ($Si_6(OH)_3H_3$)—Time Resolved Luminescence", Journal of Non–Crystalline Solids 59/60, Dec. 1983, Amsterdam NL, pp. 645–648.
Morar et al, "Growth of Epitaxial $CaSi_2$ Films on Si(111)", Journal of Vacuum Science and Tehcnology Part A, Bd. 6, No. 3, May/Jun. 1988, New York, US, pp. 1340–1342.
Brandt et al, "New Growth Technique for Luminescent Layers on Silicon", Applied Physics A. Solids and Surfaces, Bd. 54, No. 6, Jun. 1992, Heidelberg DE, pp. 567–569.

Primary Examiner—Patrick Ryan
Assistant Examiner—Marie R. Yamnitzky
Attorney, Agent, or Firm—Frishauf, Holtz, Goodman, Langer & Chick, P.C.

[57] ABSTRACT

Siloxene and siloxene derivatives are compatible with silicon and may be generated as epitaxial layer on a silicon monocrystal. This permits the production of novel and advantageous electroluminescent devices, such as displays, image converters, optoelectric integrated circuits. Siloxene and siloxene derivatives may also be advantageously employed in lasers as laser-active material and in fluorescent lamps or tubes as luminescent material.

26 Claims, 2 Drawing Sheets

← H
← O
← Si

DEVICE COMPRISING A LUMINESCENT MATERIAL

FIELD OF THE INVENTION

The present invention relates to a device including a luminescent material. Furthermore, the invention relates to a method for the production of such devices.

DESCRIPTION OF THE RELATED ART

Many devices, such as image converters, displays, optoelectronic circuits, optical ICs, lasers, etc. contain a luminescent material, generally either a crystalline phosphor such as ZnS:Mn, or in the case of electrooptical devices also a pn junction, typically in a III–V semiconductor material. A disadvantage of both types is that they are hardly compatible with the proven silicon technology used to a very wide extent and that for the production very harmful substances must frequently be employed. There is moreover a need for new luminescent materials, in particular materials which are electrically stimulatable.

SUMMARY OF THE INVENTION

The present invention therefore has as its primary objective the provision of novel luminescent devices and methods for the production of luminescent devices which are compatible with silicon semiconductor technology. Another objective of the invention resides in providing a novel electrically stimulatable material, method for the production thereof and new uses thereof.

This objective is achieved according to the invention by a device which contains as luminescent material or as sensor material siloxene and/or a siloxene derivative, in particular in polymeric, monocrystalline or polycrystalline form.

Siloxene is excellently compatible with silicon and can be made without toxic substances such as arsenic, phosphorus and the like and in the form of a compact layer; its luminescence color can be easily influenced. Siloxene and siloxene derivatives can be employed with particular advantage in electrooptical devices, such as displays, electrooptical circuits and ICs; because of its structural properties and the production methods available, its use is also however advantageous in optical devices in which an optical stimulation of the fluorescence takes place, for example for wavelength conversion in a X-ray or UV image converter layer, in integrated optical systems, for example as nonlinear material, etc.

BRIEF DESCRIPTION OF THE DRAWINGS

Hereinafter, the invention will be explained with the aid of examples of embodiment with reference to the drawings, wherein:

In FIGS. 4 to 8 the layer thicknesses are greatly exaggerated and not true to scale.

DESCRIPTION OF THE PREFERRED EMBODIMENTS

When reference is made hereinafter on occasion only to siloxene, this applies accordingly to siloxene derivatives and all structurally related substances containing silicon in double or triple coordination in planes.

Siloxene $Si_6O_3H_6$ and $Si_6O_{3+n}H_{6-m}$ and its derivatives are known, cf. for example Gmelin, Silicon, volume B, p. 591–596. It forms a highly polymerized solid insoluble substance which contains as essential constituent silicon six-membered rings or silicon planes.

Figure 1:
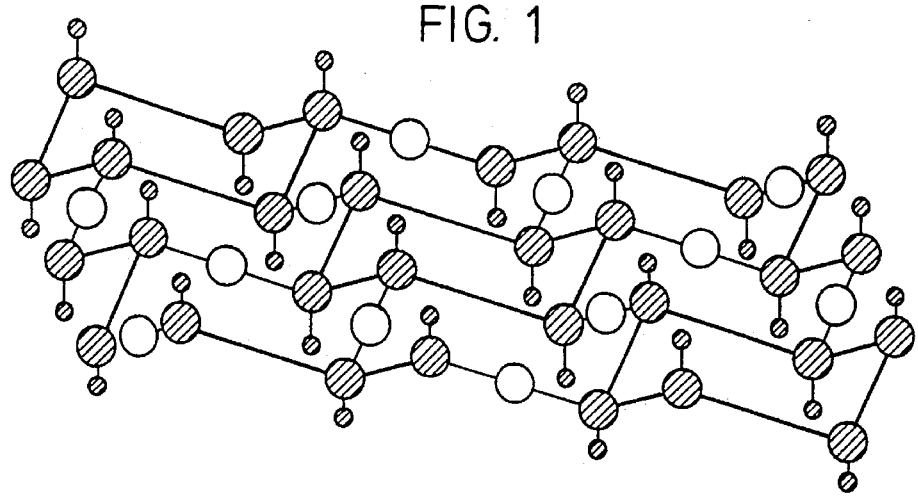
FIGS. 1 to 3 show three different structural modifications of siloxene having the same chemical composition.
Figure 2:
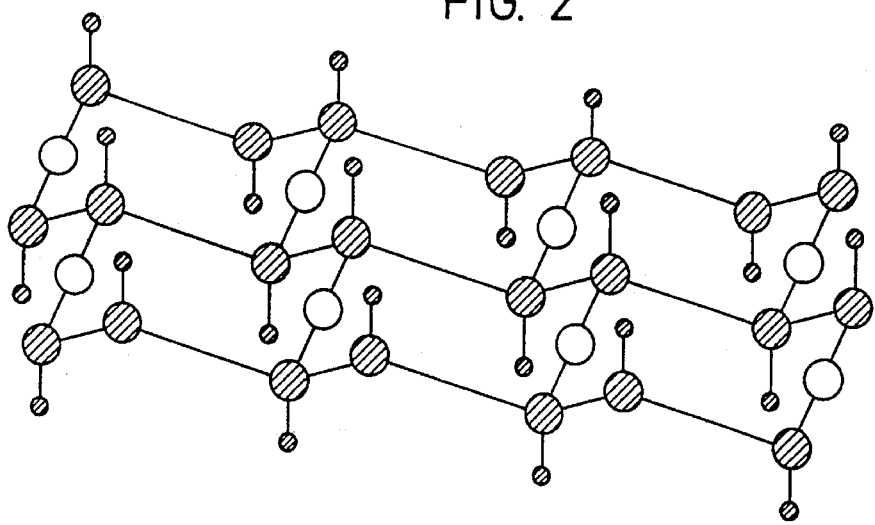
Figure 3:
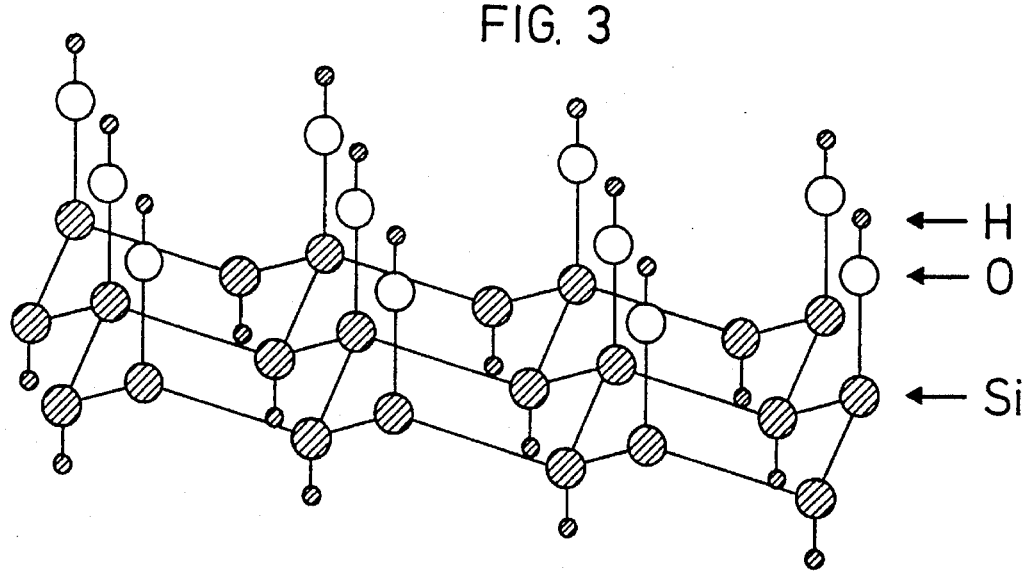

Three different structural modifications of siloxene are illustrated in FIGS. 1 to 3, each of which shows part of the [111]-plane of a siloxene crystal. The large striped circles denote Si atoms, the large blank circles O atoms and the small striped circles H atoms. The most stable structure is that according to FIG. 1, which contains pronounced six-membered rings linked together by oxygen atoms.

It is also known that siloxene exhibits photoluminescence and chemoluminescence and that the luminescence color can be varied by substitution of the H atoms of the siloxene. However, a fact hitherto not recognized was that siloxene, in particular on suitable contacting, can also exhibit electroluminescence, and nor had it been recognized that due to its constitution and the production methods available siloxene is excellently suited to uses in optical and electrooptical devices, in particular in conjunction with silicon and silicon semiconductor devices.

A particular advantage is that the lattice constants of siloxene are practically identical to those of silicon. Consequently, a siloxene layer can be applied epitaxially to a silicon monocrystal, in particular to a [111]-surface of the silicon. It is further possible to chemically convert a surface layer of a monocrystalline or polycrystalline silicon body to siloxene without substantial modification of the structure of said layer. The same applies to sapphire substrates and so-called SOS structures ("Silicon-on-Sapphire"). A further important advantage is that siloxene layers can also be applied at relatively low temperatures, in particular $\leq 800°$ C., and also to semiconductor substrates, in particular silicon substrates, which contain an integrated circuit so that by using conventional semiconductor fabrication techniques, such as photomasking, a desired configuration of electroluminescent devices on the integrated circuit can be produced. This gives an integrated electronic-electrooptical circuit. Siloxene and its derivatives can also advantageously be used on other substrates, such as glass, quartz, organic polymers (plastics), for example PMMA.

Siloxene for use as luminescent material can be made in various ways, for example by a known wet chemical method according to Kautsky (see for example Z. anorg. Chemie 117, 209–242 (1921) or Wöhler (see for example Liebig's Annals 127,257, 1863), and further by deposition from the gas phase on a suitable substrate, in particular, as mentioned above, monocrystalline silicon, for example using a mixture of $SiH_4$, $H_2O$ and/or $H_2$, $O_2$, and a dilution gas such as argon or another noble gas or nitrogen, and the reaction can be activated by light, in particular laser radiation, a plasma discharge, a high-frequency or microwave discharge, cyclotron resonance, heat, for example heating the substrate.

Further possibilities are deposition from the liquid phase, for example liquid phase epitaxy, spin-coating by means of a suspension, and also molecular beam deposition, for example molecular beam epitaxy, silicon being evaporated from an effusion cell and hydrogen and oxygen being employed as ion beams. Electrochemical methods for producing siloxene are also known.

A further wet chemical method for producing siloxene resides in subjecting calcium disilicide $CaSi_2$ (or another suitable metal silicide of similar structure, for example silicides of other alkaline earth elements, such as magnesium, strontium and barium) to the action of fuming hydrochloric acid (38% HCl) for several hours and washing the reaction product with ether or water to remove the chlorine. In another method of this type the metal silicide is treated for several hours with an ice-cooled mixture of alcohol, water or HCl and thereafter washed with ether. In this case, a mixture of 60 vol. parts ethanol, 11 vol. parts $H_2O$ and 2 vol. parts conc. HCl has proved suitable.

The reaction and the subsequent washing should be carried out away from oxygen in the dark.

To produce a homogeneous epitaxial siloxene layer on a monocrystalline silicon substrate, metal silicide, in particular $CaSi_2$, can advantageously be formed epitaxially on a [111] surface of a silicon body, as is known from publications by J. F. Morar et al. in Physical Review B, vol. 37, no. 5, Feb. 15, 1988, p. 2618–2621 and J. Vac. Sci. Technol. A 6(3), May/June 1988, p. 1340–1342. In this method, on a surface of a silicon substrate, preferably on a polished [111] surface of an Si monocrystal, a layer of calcium metal is vapour deposited with a desired thickness, for example 100 to 500 nm, and alloyed in by heating to about 800° C. This layer is then converted wet chemically to siloxene in the manner described above by the action of HCl. In this manner a dense homogeneous epitaxial siloxene layer is obtained on a monocrystalline Si substrate which can be structured by photoetching, corpuscular beam etching or any other known semiconductor structuring method.

It is also possible to apply siloxene suspended in a suitable solvent (e.g. ethanol) as a uniform thin layer to a substrate, for example by spin coating.

In an electroluminescent electronic device the substrate of the possibly structured siloxene layer has a corresponding electrode pattern and a corresponding transparent counter electrode array, for example of a thin transparent layer of gold or tin oxide, is applied to the free surface of the siloxene.

A particularly advantageous configuration of an electrooptical device consists of a layer structure including in order a substrate of p or n-conductive doped monocrystalline silicon, a thin transparent dielectric layer of for example $SiO_2$ or $Si_3N_4$, a layer of siloxene or siloxene derivative and a transparent counter electrode, for example of gold, tin or indium oxide. The transparent dielectric intermediate layer has the important function of being able to generate highly excited charge carriers by a high electric field (injection through tunnelling). The structure described can be protected from harmful environmental influences by a thin transparent layer.

The siloxene should also be protected in other cases by a protective layer, for example of a transparent material, such as $SiO_2$, which protects the siloxene from the action of oxygen, moisture and other harmful environmental influences but does not impair the optical function.

A particular advantage of the use of siloxene as luminescent material resides in that the luminescence color can be varied by heating and/or substitution, also in situ and locally selectively. This is known in the case of photoluminescence of siloxene and for adjusting the luminescence color the known substitution methods and substituents may be employed.

The hydrogen atoms of the siloxene may be successively substituted, for example by halogens, in particular Cl, by OH groups, by alcohol, a bond of a C atom of the alcohol replacing for example the hydrogen of the siloxene, or by other monovalent radicals having an electron negativity different from hydrogen. The substitution results in a widening to the crystal lattice of the siloxene in the [111]-direction. Furthermore, a shift of the fluorescence towards longer wavelengths takes place. For the substitution known method may be employed, cf. for example E. Hengge, Advances of Chemical Research 9, 145 (1967) and H. Ubara et. al., J. Non-Cryst. Solids 59&60, 641 (1983).

Since the substitution can take place after the formation and structuring of a siloxene layer, the substitution can be carried out locally differently for example by covering parts of the siloxene layer in which no or a different substitution is to take place during the substitution, for example photolithographically. In this manner siloxene regions may be provided on an integrated circuit or other electrooptical device which on electrical or optical stimulation emit different colors.

The electrical properties of the siloxene or the siloxene derivatives can be modified specifically by heating and/or doping. The electrical conductivity of the siloxene may be influenced by substitution of a silicon atom of the plane or by interstitial doping, in particular with alkali metals, for example Li or Cs. Furthermore, the conductivity of the plane can be modified by intercollation of suitable molecules between every two planes. Finally, since undoped siloxene is an insulator, the conductivity of the silicon planes in a field-effect configuration can also be varied by charge transfer from a conductive substrate into the silicon planes.

One property of luminescence of siloxene and its derivatives is a wide spread of excitation lifetimes which may be undesirable for uses in optoelectronic communications technology (data transmission). It may be necessary here to control the excitation lifetimes specifically by incorporating recombination centres, in particular in the form of crystal defects. This may for example be done by treating with ionizing radiation, such as ion beams, or by oxidation, and the incorporation of recombination centres may be carried out in locally selective manner in order to obtain a local structuring of the emission properties of a siloxene layer.

Due to their structural properties and the optical properties, in particular the efficient photoluminescence, it is also advantageous to use siloxene and siloxene derivatives in other optical devices which operate with luminescence but not with electrical stimulation of the siloxene. It is possible with the production methods referred to above to deposit siloxene epitaxial layers or thin films with spatially constant or controlled variable redractive index on substrates such as crystalline silicon. Examples of such applications are the use of thin siloxene layers on silicon as sensor elements or optical waveguides. A concrete example is a sensor oroxidizing media. The oxidation of the siloxene generates a chemoluminescence which is detected electrically in the silicon.

Also advantageous is the deposition of siloxene or siloxene derivative on existing photosensitive structures for spectral matching (solar cells, image converters, in particular for converting corpuscular radiation, X-ray radiation or ultraviolet light to visible radiation, for improving the sensitivity). This makes it possible in particular to compensate at least partially the pronounced drop of the quantum efficiency of photodiodes on the basis of crystalline silicon in the wavelength range above 400 nm. It is possible to increase the efficiency of Si-solar cells by a thin layer of siloxene which acts as antireflex layer and converts short-wave light, in particular UV light, to light of longer wavelengths for which the Si-sdar cell has a greater sensitivity.

Since siloxene does not exhibit inversion symmetry (the crystalline structure cannot be transferred to itself by reflecting at a point) it can be employed for optical frequency doubling.

Siloxene layers of adequate thickness are suitable as scintillator material for detecting ionizing radiation and may be employed with a material combination (siloxene on silicon) which is completely compatible with silicon technology. The advantage here resides in particular in the fact that no impurities are introduced and in the deposition of siloxene, for example from a plasma, large surfaces can also be formed. This use is expedient for example in combination with large-area amorphous silicon substrates.

A further field of use is integrated optics on the basis of silicon. Here, at present materials such as $SiO_2$ or oxinitrides are considered which however are not optically active in the visible range. Siloxene is compatible with silicon technology similarly to the aforementioned dielectrics, has a smaller refractive index than silicon and moreover due to its high luminescence yield has properties which can be exploited in the production of optically active components in integrated optics without requiring for this purpose substances foreign to silicon technology. For example, siloxene or siloxene derivative can be employed in such applications as optically nonlinear material for optical modulators, for multiplexers and lasers. In crystalline form or in a suspension, siloxene may also be employed directly as active laser material.

The electroluminescence may be stimulated both with direct current and with alternating current.

With reference to FIGS. 4 to 8, some specific examples of embodiments of the invention will now be explained hereinafter.

Figure 4:
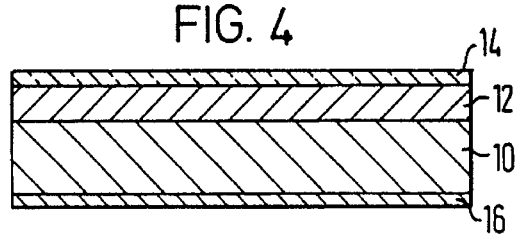
FIG. 4 shows a schematic sectional view of a semiconductor device according to the invention containing siloxene as an electroluminescent material.

FIG. 4 shows an electroluminescent device including a substrate 10 of doped monocrystalline silicon. In this example the substrate is highly n-conductive and has a specific resistance of the order of magnitude of a few ohm-cm. Disposed on the silicon monocrystal forming the substrate 10 is an epitaxial siloxene layer 12 and on the latter a transparent electrode 14 of $SnO_2$ or other known transparent conductive material compatible with siloxene is disposed. On the side of the substrate 10 remote from the siloxene layer 12 a rear electrode 16 in the form of a vapour-deposited aluminium layer or the like is applied.

If a voltage is applied to the electrodes 14, 16 electrons are injected from the n-conductive substrate 10 and holes from the transparent counter electrode 14 into the siloxene layer 12 so that an electroluminescence occurs in the latter.

Instead of an n-conductive substrate, a p-conductive substrate may also be employed, the aforementioned signs of the charge carriers then being reversed.

Figure 5:
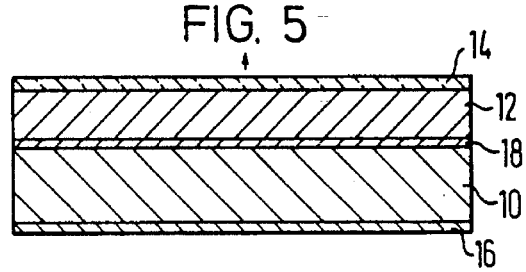
FIG. 5 shows a modification of the device according to FIG. 4.

The embodiment according to FIG. 5 corresponds to that according to FIG. 4 except that between the substrate 10 and the siloxene layer 14 a thin insulating layer 18 is arranged. In a practical example of embodiment the insulating layer 18 consists of $SiO_2$ and has a thickness of about 5 nm to 100 nm. For this purpose, possibly a commercially available Si substrate material with buried oxide layer may be employed. The insulating layer 18 is so thin that the charge carriers, i.e. in this case the electrons, tunnel therethrough when a voltage of adequate magnitude negative with respect to the electrode 14 is applied to the electrode 16. In this arrangement, the charge carriers injected into the siloxene layer 14 have a higher energy as regards the conduction band edge of siloxene than in the device according to FIG. 4 and consequently a more efficient injection and thus higher luminescence yield are obtained.

Figure 6:
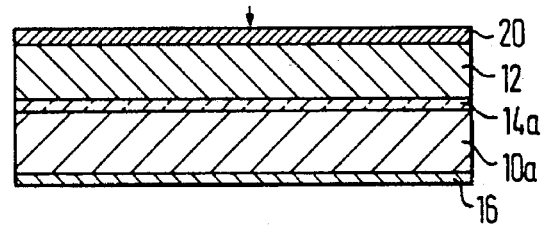
FIG. 6 shows a schematic sectional view of a further example of embodiment of the invention.

The device according to FIG. 6 contains as substrate 10a a pn or pin photodiode of conventional design which has a rear electrode 16 and a transparent electrode 14 on its light entrance side. Disposed on the transparent electrode 14a is a siloxene layer 12 which in turn is covered by a transparent protective layer 20, for example of silicon dioxide. Electromagnetic radiation, in particular shortwave radiation such as UV or X-ray radiation, as well as corpuscular radiation, which enters the siloxene layer 12 through the protective layer 20 is converted therein to radiation of longer wavelength which in turn is converted by the photodiode 10a, 14a, 16 with high efficiency to electrical signal.

In a modification of the device according to FIG. 6, which can be used as sensor device, the protective layer 20 is not present or is permeable or perforated so that a substance to be detected can generate in the siloxene layer chemoluminescence which is detected by the photodiode 10a.

Figure 7:
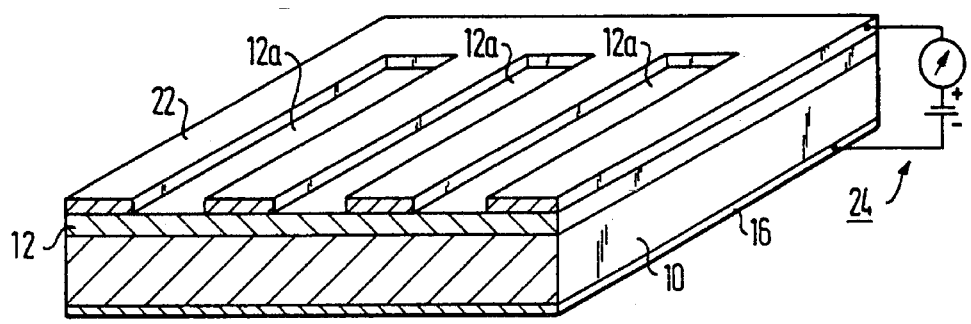
FIG. 7 shows a schematic view of a sensor device according to the invention.

FIG. 7 shows a sensor device which includes a substrate 10 of doped silicon, a real electrode 16 attached to the rear side thereof and a siloxene layer 12 disposed on the upper side. On the siloxene layer there is an electrode structure 22 which ill this case is formed in comb-like manner and leaves free portions 12a of the surface of the siloxene layer so that aid portions are exposed to the atmosphere. Under the action of radicals, such as oxidizing radicals, halogens, etc., the conductivity of the diode-like structure formed by the silicon substrate 10 and the siloxene layer 12 varies. A corresponding signal then occurs in a circuit 24 which contains this structure and is only schematically illustrated.

Figure 8:
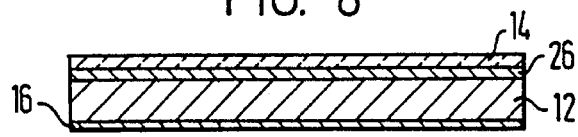
FIG. 8 shows a schematic sectional view of a particularly simple embodiment of the invention.

FIG. 8 shows a particularly simple example of an embodiment according to the present invention. The device according to FIG. 8 includes a thin siloxene layer 12 which is provided on the one side with a rear electrode 16 and on the other side with a transparent electrode 14. By applying an ac voltage to the electrodes 14, 16 the siloxene is stimulated to electroluminescence. The rear electrode can be formed as a support structure and consists then for example of a metal plate and/or forms an injecting contact, for example a Schottky contact. Between the siloxene layer 12 and the transparent electrode 14, in this case a thin transparent dielectric layer 26 of $SiO_2$ or the like is also disposed and permits generation of a higher field strength in the siloxene. Such a dielectric layer may also be provided in the devices according to FIGS. 4, 5 and 7.

Siloxene may also be advantageously employed as luminescent material in fluorescent lamps or tubes, in particular in combination with other luminescent materials. Here as well the siloxene is stimulated both by the UV radiation generated in the discharged and by electron bombardment.

We claim:

1. A device comprising (a) a crystalline luminescent material, the luminescent material being selected from the group consisting of (i) unsubstituted siloxene, (ii) substituted siloxene in which hydrogen atoms are substituted by another monovalent group and (iii) allotropic modifications of said unsubstituted and substituted siloxene and (b) two electrodes, the luminescent material being disposed between the electrodes, at least one of the electrodes comprising a transparent layer.

2. A device according to claim 1, which further comprises a dielectric layer between said luminescent material and an electrode.

3. A device according to claim 1, wherein said luminescent material is doped.

4. A device according to claim 1, wherein said luminescent material is a substituted siloxene wherein hydrogen atoms are substituted by another monovalent group selected from the group consisting of a halogen an OH-group an alcohol group bonded through a C atom of the alcohol group and a monovalent radical having an electron negativity different from hydrogen.

5. A device according to claim 4, wherein the monovalent group is chlorine.

6. A device according to claim 1, wherein at least a part of the hydrogen of the siloxene is substituted.

7. A device according to claim 1, wherein recombination centers and/or doping atoms are incorporated into the siloxene.

8. A device according to claim 1, wherein the luminescent material is selected from the group consisting of 9. A device according to claim 1, wherein said luminescent material is arranged as a layer on a substrate which is comprised of a doped semiconductor material and a first one of the two electrodes is the transparent electrode and is disposed on the luminescent material and a second one of the two electrodes is disposed on a surface of the substrate opposite to the surface of the substrate having the luminescent material disposed thereon.

10. A device according to claim 9, wherein the substrate is doped monocrystalline silicon and the first electrode is made of $SnO_2$ and the second electrode is made of vapor-deposited aluminum.

11. A device according to claim 9, which further comprises an insulating layer which is disposed between the substrate and the luminescent material, said insulating layer being made of $SiO_2$ and having a thickness of 5 nm to 100 nm.

12. A device according to claim 9, wherein the luminescent material is applied to a silicon substrate.

13. A device according to claim 14, wherein the silicon substrate is monocrystalline.

14. A device according to claim 13, wherein the silicon substrate contains an integrated circuit.

15. A device according to claim 13, wherein said luminescent material forms an epitaxial structure on the silicon substrate.

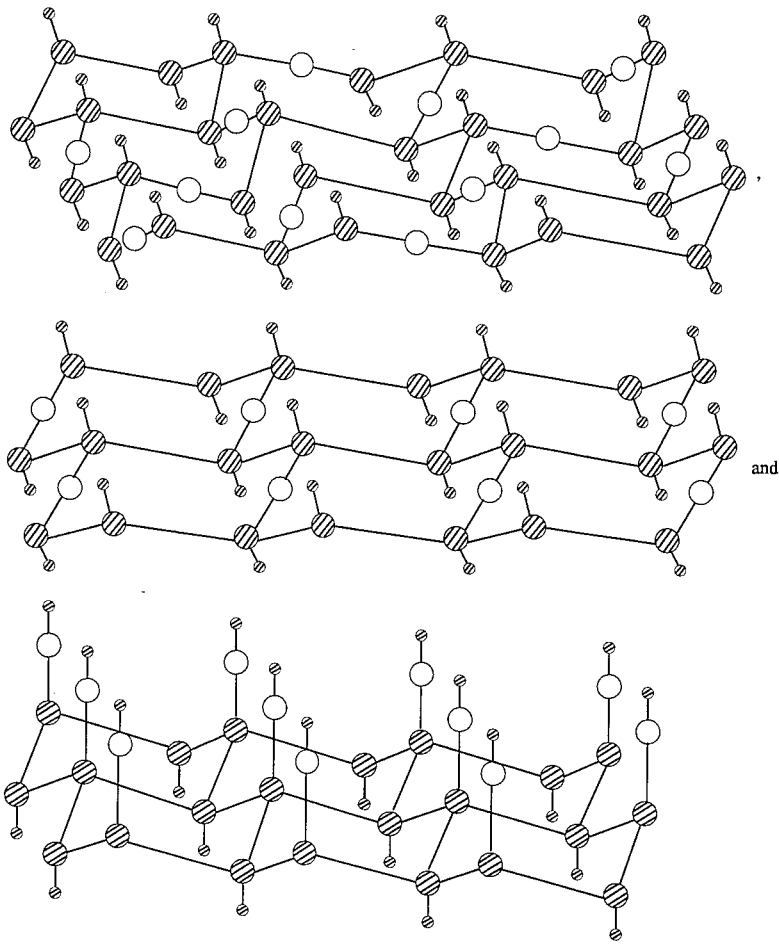

wherein ⊖ is hydrogen, ◯ is oxygen and ⊜ is silicon.

16. In a display comprising a substrate and layer of a luminescent material disposed between two electrodes, at least one of the electrodes comprising a transparent layer, wherein the improvement comprises the luminescent material being crystalline and being selected from the group consisting of (i) unsubstituted siloxene, (ii) substituted siloxene in which hydrogen atoms are substituted by another monovalent group and (iii) allotropic modifications of said unsubstituted and substituted siloxenes.

17. In an image converter comprising a substrate and a layer of a luminescent material disposed between two electrodes, at least one of the electrodes comprising a transparent layer, wherein the improvement comprises the luminescent material being crystalline and being selected from the group consisting of (i) unsubstituted siloxene, (ii) substituted siloxene in which hydrogen atoms are substituted by another monovalent group and (iii) allotropic modifications of said unsubstituted and substituted siloxenes.

18. In an optoelectronic device including a substrate and a layer of a luminescent material disposed between two electrodes, at least one of the electrodes comprising a transparent layer, wherein the improvement comprises the luminescent material being crystalline and being selected from the group consisting of (i) unsubstituted siloxene, (ii) substituted siloxene in which hydrogen atoms are substituted by another monovalent group and (iii) allotropic modifications of said unsubstituted and substituted siloxenes.

19. An optoelectronic device as claimed in claim 18 wherein said substrate, said two electrodes and said luminescent material form a light emitting diode.

20. In an integrated optical device comprising a substrate and a layer of a luminescent material disposed between two electrodes, at least one of the electrodes comprising a transparent layer, wherein the improvement comprises the luminescent material being crystalline and being selected from the group consisting of (i) unsubstituted siloxene, (ii) substituted siloxene in which hydrogen atoms are substituted by another monovalent group and (iii) allotropic modifications of said unsubstituted and substituted siloxenes.

21. In a scintillator device comprising a luminescent material disposed between two electrodes, at least one of the electrodes comprising a transparent layer, wherein the improvement comprises the luminescent material being crystalline and being selected from the group consisting of (i) unsubstituted siloxene, (ii) substituted siloxene in which hydrogen atoms are substituted by another monovalent group and (iii) allotropic modifications of said unsubstituted and substituted siloxenes.

22. In a laser device comprising a substrate and a layer of laser-active luminescent material disposed between two electrodes, at least one of the electrodes comprising transparent layer, wherein the improvement comprises the luminescent material being crystalline and being selected from the group consisting of (i) unsubstituted siloxene (ii) substituted siloxene in which hydrogen atoms are substituted by another monovalent group and (iii) allotropic modifications of said unsubstituted and substituted siloxenes.

23. In a photoelectric device for the purpose of energy conversion including a luminescent material disposed between two electrodes, at least one of the electrodes comprising a transparent layer, wherein the improvement comprises the luminescent material being crystalline and being selected from the group consisting of (i) unsubstituted siloxene, (ii) substituted siloxene in which hydrogen atoms are substituted by another monovalent group and iii) allotropic modifications of said unsubstituted and substituted siloxenes.

24. A device comprising (a) a luminescent material containing a modified siloxene formed by silicon atoms linked by direct chemical bonds to form planes, each silicon atom forming three chemical bonds to three other silicon atoms and a fourth chemical bond to either a hydrogen atom or OH-group and (b) two electrodes, the luminescent material being disposed between the electrodes, at least one of the electrodes comprising a transparent layer.

25. A device comprising (a) a luminescent material containing a modified siloxene formed by silicon atoms linked by direct chemical bonds to form chains, the chains being interconnected by oxygen bridges and each silicon atom forming two chemical bonds to two other silicon atoms, one chemical bond to one oxygen atom and one chemical bond to one hydrogen atom and (b) two electrodes, the luminescent material being disposed between the electrodes, at least one of the electrodes comprising a transparent layer.

26. A device comprising (a) a luminescent material containing a modified siloxene formed by silicon atoms linked by direct chemical bonds to form six-membered rings, the rings being interconnected by oxygen bridges and each silicon atom forming two chemical bonds to two other silicon atoms, one chemical bond to one oxygen atom and one chemical bond to one hydrogen atom, and (b) two electrodes, the luminescent material being disposed between the electrodes, at least one of the electrodes comprising a transparent layer.

* * * * *